(12) United States Patent
Liu et al.

(10) Patent No.: US 8,120,720 B2
(45) Date of Patent: Feb. 21, 2012

(54) PIXEL STRUCTURE

(75) Inventors: Chih-Chung Liu, Guangdong (CN); XiYao Li, Guangdong (CN)

(73) Assignee: Century Display(ShenZhen)Co., Ltd., Baoan, Shen-zhen, Guangdong (CN)

( * ) Notice: Subject to any disclaimer, the term of this patent is extended or adjusted under 35 U.S.C. 154(b) by 77 days.

(21) Appl. No.: 12/868,745

(22) Filed: Aug. 26, 2010

(65) Prior Publication Data

US 2011/0133194 A1    Jun. 9, 2011

Related U.S. Application Data

(63) Continuation of application No. PCT/CN2009/076055, filed on Dec. 25, 2009.

(30) Foreign Application Priority Data

Dec. 3, 2009  (CN) .......................... 2009 1 0253586

(51) Int. Cl.
*G02F 1/136* (2006.01)
(52) U.S. Cl. .............................. 349/43; 349/139; 257/59

(58) Field of Classification Search ................... 349/43, 349/41, 139, 140; 257/59, E33.053
See application file for complete search history.

(56) References Cited

U.S. PATENT DOCUMENTS 7,843,519 B2 * 11/2010 He et al. .......................... 349/38
8,045,079 B2 * 10/2011 Jung et al. ....................... 349/43

* cited by examiner

*Primary Examiner* — Thoi Duong
(74) *Attorney, Agent, or Firm* — Winston Hsu; Scott Margo (57) ABSTRACT

A pixel structure includes a scan line, a data line, a gate electrode electrically connected to the scan line, a semiconductor layer disposed on the gate electrode, a drain electrode, an extending electrode, and a pixel electrode. The scan line and the data line cross each other, and are insulated. The drain electrode includes a contact part disposed outside the gate electrode, an electrode part disposed on the semiconductor pattern and a connecting part extending from the contact part along a direction to connect the electrode part, and partially overlapping the gate electrode. The pixel electrode is connected to the contact part. The extending electrode is connected to the scan line. A first end of the extending electrode points to the semiconductor layer along the direction, and overlaps the drain electrode. A first width of the connecting part is equal to the second width of the extending electrode.

16 Claims, 6 Drawing Sheets

PIXEL STRUCTURE

CROSS REFERENCE TO RELATED APPLICATIONS

This application is a continuation of International Application No. PCT/CN2009/076055 filed Dec. 25, 2009.

BACKGROUND OF THE INVENTION

1. Field of the Invention

The present invention relates to a pixel structure, and more particularly, to a pixel structure having a constant gate-drain parasitic capacitance.

2. Description of the Prior Art

Conventional TFT-LCD (thin film transistor liquid crystal display) includes a TFT array substrate, a counter substrate and a liquid crystal layer sandwiched in-between. The TFT array substrate includes a plurality of scan lines, a plurality of data lines, a plurality of TFTs disposed between the scan lines and the data lines and a pixel electrode disposed corresponding to each TFT. The counter substrate includes a common electrode. Each aforementioned TFT includes a gate electrode, a semiconductor layer, a source electrode and a drain electrode, and functions as a switching element of a liquid crystal unit.

The manufacturing process of the TFT array substrate usually includes a plurality of exposure, photolithography and etching processes. In general manufacturing technology, the gate electrode and the scan line are formed by a first metal layer, and the source electrode, the drain electrode and the data line are formed by a second metal layer. At least an inter-layer dielectric (ILD) layer is disposed between the first metal layer and the second metal layer. In the TFT structure, the gate electrode at least partially overlaps the drain electrode; therefore, the so-called gate-drain parasitic capacitance (Cgd) exists due to the overlapping of the gate electrode and the drain electrode.

With regard to the LCD, a voltage transferred from the data line is applied to a liquid crystal capacitor Clc formed by the pixel electrode, the common electrode and the liquid crystal layer; and the voltage has a specific relation to a transmittance of liquid crystal molecules in the liquid crystal layer. The voltage applied to the liquid crystal capacitor Clc depends on grayscale values of an image displayed. However, due to the existence of the gate-drain parasitic capacitance, the voltage difference on the liquid crystal capacitor Clc will vary when the signal on the gate line varies. The voltage change is known as the feed-through voltage $\Delta Vp$, and can be represented by an equation below.

$$\Delta Vp = [Cgd/(Clc+Cgd+Cst)](Vgon-Vgoff)$$

Where Vgon−Vgoff represents an amplitude of a voltage pulse applied on the scan line, and Cst stands for a storage capacitor.

During the TFT manufacturing process, a misalignment by the machine movement may cause the TFT components to deviate from their designated positions. Especially, an overlapping area of the gate electrode and the drain electrode varies, therefore, the gate-drain parasitic capacitance Cgd varies as well and different pixels have different feed-through voltages $\Delta Vp$. A problem of display picture quality degradation is generated during displaying; therefore, an objective for the TFTs to keep the gate-drain parasitic capacitances (Cgd) stable is desired.

SUMMARY OF THE INVENTION

The present invention provides a pixel structure capable of ensuring stability of the gate-drain parasitic capacitances when misalignment is generated.

According to a preferred embodiment of the present invention, a pixel structure is provided. The pixel structure includes a scan line, a data line, a gate electrode, a semiconductor layer, a source electrode, a drain electrode, an extending electrode and a pixel electrode. The scan line and the data line cross each other, and are electrically insulated from each other. The gate electrode is electrically connected to the scan line. The semiconductor layer is disposed on the gate electrode. The source electrode has at least a portion disposed on the semiconductor layer, and the drain electrode has at least a portion disposed on the semiconductor layer. The source electrode is connected to the data line. The drain electrode includes a contact part, an electrode part and a connecting part. The contact part is disposed outside the gate electrode. The electrode part is disposed on the semiconductor layer. The connecting part extends from the contact part along a direction to connect the electrode part, and overlaps a portion of the gate electrode. The connecting part has a first width. The extending electrode is connected to the scan line. The extending electrode has a first end, and the first end points to the semiconductor layer along the direction and overlaps the drain electrode. The extending electrode has a second width, and the first width of the connecting part is substantially equal to the second width. The pixel electrode is connected to the contact part of the drain electrode.

In an embodiment of the present invention, the pixel structure further includes a semiconductor pattern, disposed between the extending electrode and the drain electrode, and located at an overlapping area of the extending electrode and the drain electrode.

In an embodiment of the present invention, the extending electrode has a second end away from the first end, and the second end is connected to the scan line. For example, the extending electrode is L-shaped. Furthermore, the extending electrode is substantially U-shaped.

In another embodiment of the present invention, the electrode part of the drain electrode is a U-shaped part surrounding the source electrode, and the U-shaped part has a base and two branches extending from two ends of the base toward the direction. The connecting part of the drain electrode is connected to the base or one of the branches of the U-shaped part.

In another embodiment of the present invention, the source electrode is U-shaped so that it surrounds the electrode part of the drain electrode. The electrode part of the drain electrode and the connecting part are connected to each other, and form a strip pattern.

In another embodiment of the present invention, the drain electrode further includes a protrusion part, the contact part is disposed between the connecting part and the protrusion part, and the protrusion part is parallel to the direction and overlaps the extending electrode.

In another embodiment of the present invention, the drain electrode further includes a protrusion part paralleled to an edge of the gate electrode and located outside the gate electrode which is not overlapped by the protrusion part, and the protrusion part is connected to the contact part and overlaps the extending electrode.

In another embodiment of the present invention, the contact part, the electrode part and the connecting part of the drain electrode are formed integrally.

In another embodiment of the present invention, the source electrode and the data line are formed integrally.

In another embodiment of the present invention, the gate electrode is a portion of the scan line, and the extending electrode is connected to the gate electrode.

In another embodiment of the present invention, the gate electrode extends from the scan line to form at least a portion of the gate electrode outside the scan line.

As mentioned above, the present invention disposes an extending electrode connected to the scan line or the gate electrode, and an end of the extending electrode overlaps the drain electrode. When the relative position between the gate electrode and the drain electrode varies due to the misalignment in the manufacturing process, the gate-drain parasitic capacitances still are the same as that of the predetermined layout. For this reason, the pixel structure has a high tolerance for the misalignment, and keeps a stable display picture quality.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
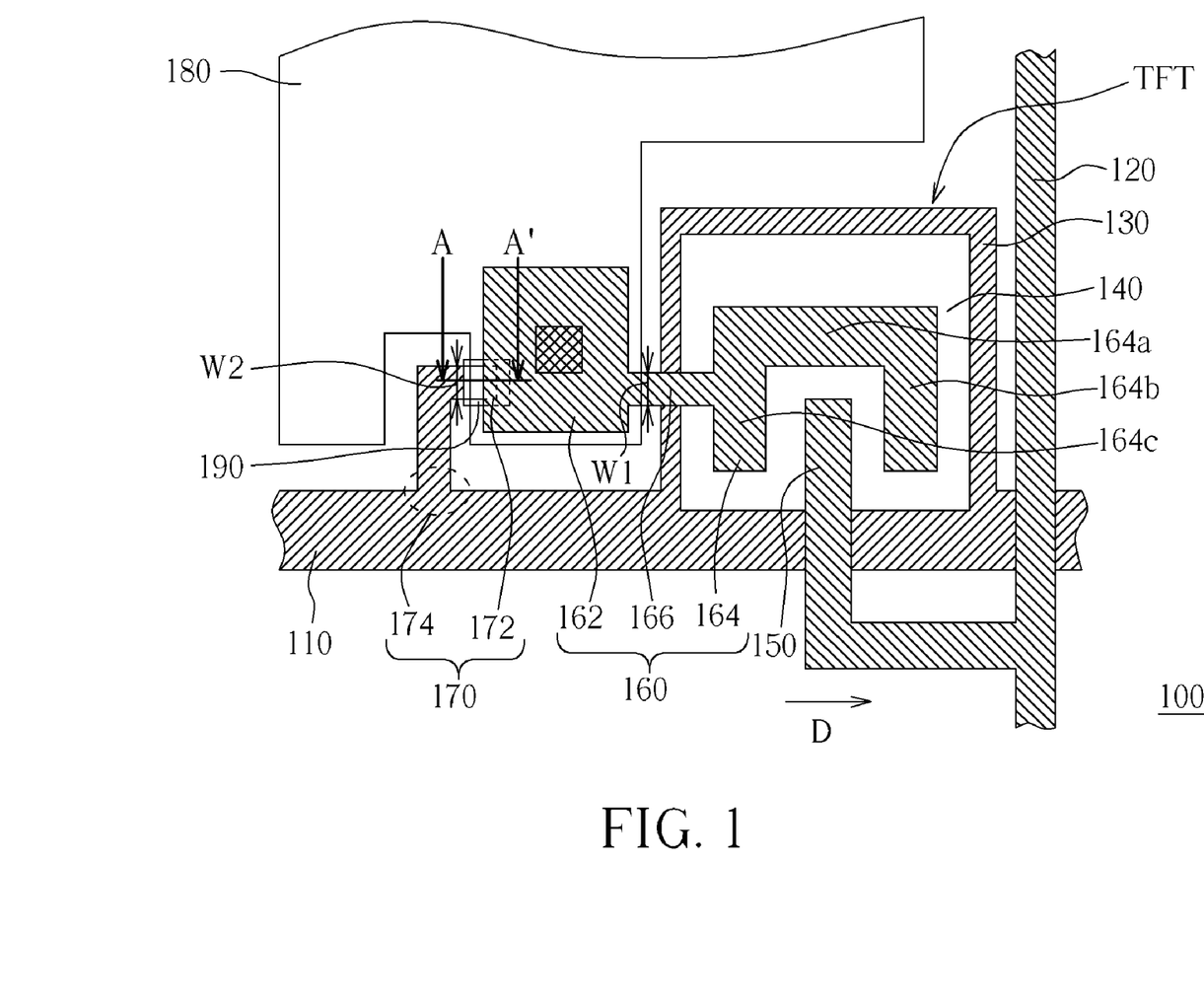
FIG. 1 shows a schematic diagram illustrating a sectional top view of a pixel structure according to a first embodiment of the present invention.
Figure 2:
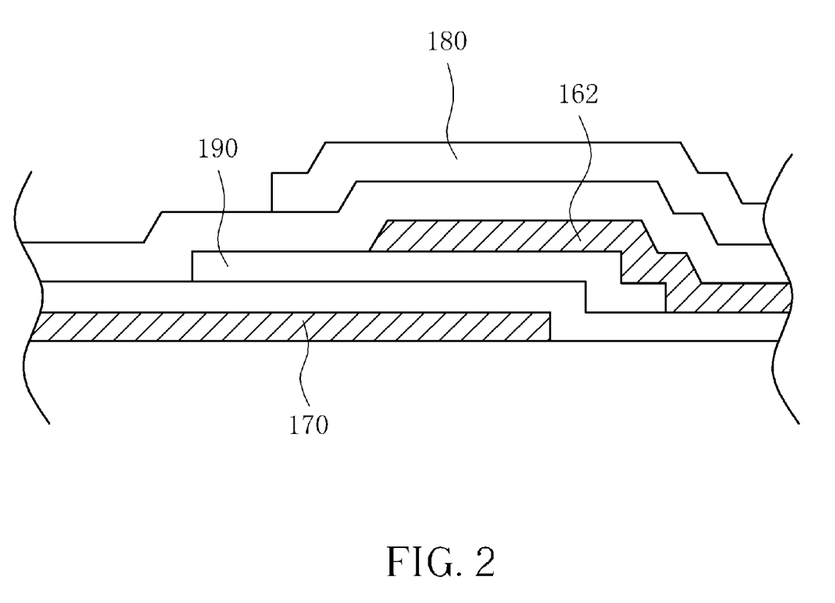
FIG. 2 is a cross-sectional view of the pixel structure, taken along a line AA' of FIG. 1.

FIG. 1 shows a schematic diagram illustrating a sectional top view of a pixel structure according to a first embodiment of the present invention. FIG. 2 is a cross-sectional view of the pixel structure, taken along a line AA' of FIG. 1. As shown in FIG. 1 and FIG. 2, a pixel structure 100 includes a scan line 110, a data line 120, a gate electrode 130, a semiconductor layer 140, a source electrode 150, a drain electrode 160, an extending electrode 170 and a pixel electrode 180. The scan line 110 and the data line 120 cross each other, and are electrically insulated from each other. The gate electrode 130 is electrically connected to the scan line 110. The semiconductor layer 140 is disposed on the gate electrode 130. The source electrode 150 has at least a portion disposed on the semiconductor layer 140, and the drain electrode 160 has at least a portion disposed on the semiconductor layer 140. The source electrode 150 is connected to the data line 120. The extending electrode 170 is connected to the scan line 110, and the pixel electrode 180 is electrically connected to the drain electrode 160. In addition, the pixel structure 100 further includes a semiconductor pattern 190. The semiconductor pattern 190 is disposed between the extending electrode 170 and the drain electrode 160 (FIG. 2), and is disposed at an overlapping area of extending electrode 170 and the drain electrode 160 (FIG. 1). The gate electrode 130, the semiconductor layer 140, the source electrode 150 and the drain electrode 160 constitute a thin-film transistor (TFT). When the pixel structure 100 displays an image, the TFT can be turned on to transfer a signal on the data line 120 to the pixel electrode 180.

The drain electrode 160 of this embodiment includes a contact part 162, an electrode part 164 and a connecting part 166. The contact part 162 is disposed outside the gate electrode 130, and the electrode part 164 is disposed on the semiconductor layer 140. The connecting part 166 extends along a direction D from the contact part 162 to connect the electrode part 164, and partially overlaps the gate electrode 130. In this embodiment, the contact part 162 is a part of the drain electrode 160 being in contact with the pixel electrode 180, and the electrode part 164 is apart disposed on the gate electrode 130 and being in contact with the semiconductor layer 140. Furthermore, a distance between the electrode part 164 and the source electrode 150 is fixed, and the TFT has a good operating efficiency.

In this embodiment, the gate electrode 130 and the extending electrode 170 directly extend from the scan line 110, so that a portion of the gate electrode 130 and a portion of the extending electrode 170 are formed outside the scan line, and the scan line 110 is electrically connected to the gate electrode 130 and the extending electrode 170 respectively. Generally, in a manufacturing process of the pixel structure 100, the scan line 110, the gate electrode 130 and the extending electrode 170 are formed by patterning a first metal layer, and the data line 120, the source electrode 150 and the drain electrode 160 are formed by patterning a second metal layer. In addition, a person skilled in the art should know that at least one dielectric layer is further disposed between the first metal layer and the second metal layer, and at least one dielectric layer is further disposed between the second metal layer and the pixel electrode 180 in order to maintain electrical characteristics of each component in the pixel structure 100.

Especially, since the scan line 110, the gate electrode 130, and the extending electrode 170 are formed by using of a photolithographic and etching process through a mask on the first metal layer, a relative stable position among the scan line 110, the gate electrode 130 and the extending electrode 170 will be obtained. Subsequent the foregoing mentioned mask process, a photolithographic and etching process through a different mask on the second metal layer is performed to form the data line 120, the source electrode 150, and the drain electrode 160, thus, a relative stable position among the data line 120, the source electrode 150, and the drain electrode 160 will be obtained as a result of applying the same mask. As we can see from the above, when the gate electrode 130 and the drain electrode 160 are formed by two different photolithographic and etching processes with two different masks, a misalignment of the two masks occurs in the alignment step causing the position between the gate electrode 130 and the drain electrode 160 to skew from its predetermined layout. For this reason, the overlapping area of the gate electrode 130 and the drain electrode 160 is different from the predetermined design area, and each different pixel may have a different overlapping area of the gate electrode 130 and the drain electrode 160, i.e. a different pixel may have a different gate-drain parasitic capacitance. In the prior art, different gate-drain parasitic capacitances in different pixels have a negative impact on the display picture quality of the pixel structure 100. Therefore, the pixel structure 100 of this embodiment has the extending electrode 170 to help keep the gate-drain parasitic capacitance stable.

Specifically, a relation between the extending electrode 170 and the drain electrode 160 of this embodiment will be described as follows. The extending electrode 170 has a first end 172, and the first end 172 points to the semiconductor layer 140 along the direction D and overlaps the contact part 162 of the drain electrode 160. The extending electrode 170 substantially has an L-shaped pattern. The extending electrode 170 has a second end 174, and the second end 174 away from the first end 172 is directly connected to the scan line 110. Accordingly, the extending electrode 170 has an identical electric potential with the scan line 110 or the gate electrode 130. Because the extending electrode 170 is connected to the scan line 110 to electrically connect the gate electrode 130, and a semiconductor pattern 190 is disposed between the extending electrode 170 and the contact part 162, an effect of a capacitor due to the overlapping of the extending electrode 170 and the drain electrode 160 is substantially equivalent to an effect of the capacitor due to the overlapping of the gate electrode 130 and the drain electrode 160. The gate-drain parasitic capacitance in the pixel structure 100 is determined by the overlapping area of the extending electrode 170 and the contact part 162 and the overlapping area of the gate electrode 130 and the drain electrode 160.

In the manufacturing process of the pixel structure 100, the misalignment causes the drain electrode 160 to shift along the direction D or the opposite direction of the direction D relative to the gate electrode 130. If the drain electrode 160 shifts along the direction D, the overlapping area of the connecting part 166 and the gate electrode 130 is increased. At the same time, the contact part 162 is shifted close to the gate electrode 130 along the direction D, and the overlapping area of the contact part 162 and the extending electrode 170 is therefore decreased. In this embodiment, the connecting part 166 has a first width W1, and the first end 172 of the extending electrode 170 has a second width W2. The first width W1 is substantially equal to the second width W2. Although the misalignment is generated during the process in the pixel structure 100, a sum of the overlapping area of the extending electrode 170 and the contact part 162 and the overlapping area of the gate electrode 130 and the drain electrode 160 is not changed. This means the gate-drain parasitic capacitance in the pixel structure 100 can be maintained constantly.

In this embodiment, the first width W1 is substantially equal to the second width W2, and the increase of the overlapping area of the connecting part 166 and the gate electrode 130 is substantially equal to the decrease of the overlapping area of the contact part 162 and the extending electrode 170 when the misalignment is generated. Similarly, if the misalignment causes the drain electrode 160 to shift toward the opposite direction of the direction D relative to the gate electrode 130, the decrease of the overlapping area of the connecting part 166 and the gate electrode 130 is substantially equal to the increase of the overlapping area of the contact part 162 and the extending electrode 170. According to the pixel structure 100, although the misalignment is generated, the gate-drain parasitic capacitance in the pixel structure 100 will be equal to the predetermined value. In other words, when the drain electrode 160 overlaps the gate electrode 130 to form a first overlapping area, and the drain electrode 160 overlaps the extending electrode 170 to form a second overlapping area, the sum of the first overlapping area and the second overlapping area will not vary due to the misalignment. Therefore, the tolerance of the pixel structure 100 for the misalignment is higher than that of the conventional pixel structure, and a better display picture quality is obtained.

In addition, the electrode part 164 is U-shaped, and the source electrode 150 is L-shaped. A first end of the L-shaped source electrode 150 is connected to the data line 120, and a second end of the L-shaped source electrode 150 is surrounded by the U-shaped electrode part 164. Specifically, the U-shaped electrode part 164 has a base 164a and two branches 164b, 164c extending from two ends of the base 164a toward the scan line 110. A first end of the connecting part 166 is connected to one of the branches 164c.

Although the TFT design of the present invention has been described above, the present invention is not limited thereof.

Figure 3:
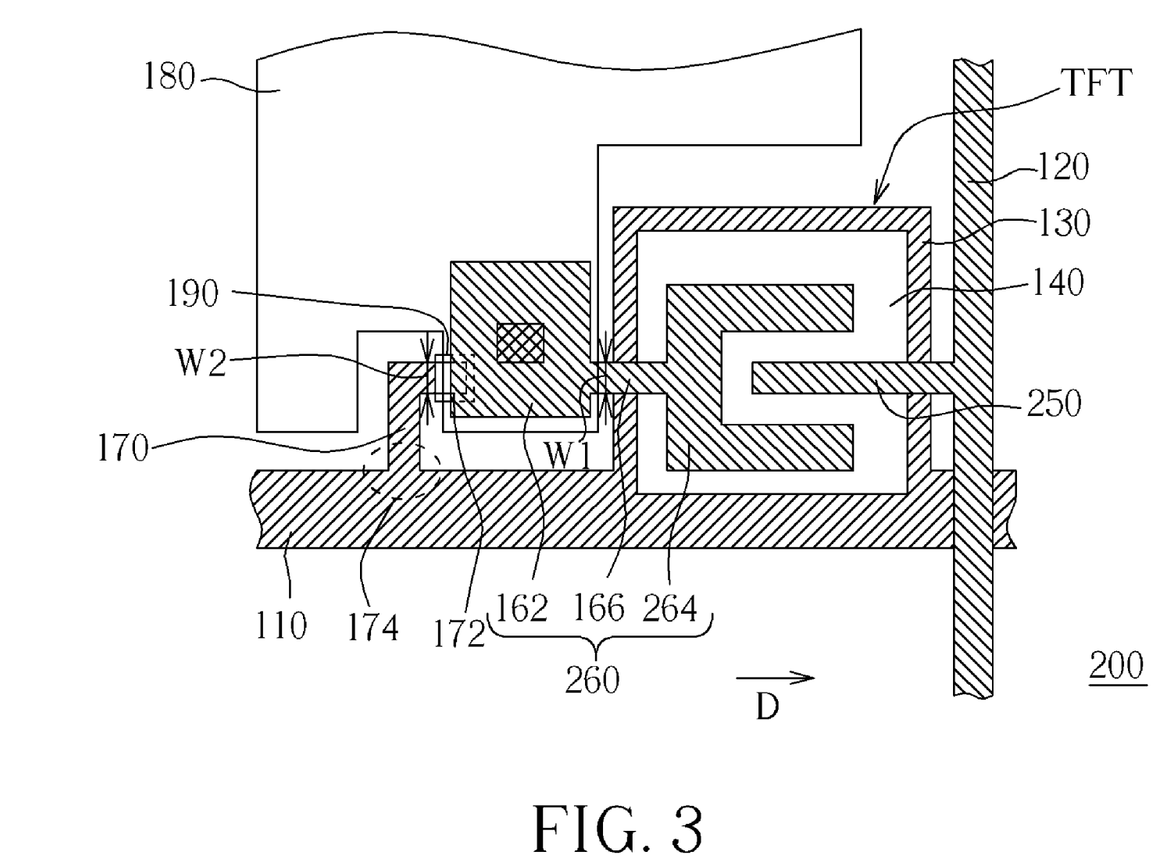
FIG. 3 is a schematic diagram illustrating a sectional top view of a pixel structure according to a second embodiment of the present invention.

FIG. 3 is a schematic diagram illustrating a sectional top view of a pixel structure according to a second embodiment of the present invention. As shown in FIG. 3, the pixel structure 200 is similar to the above-mentioned pixel structure 100, and the same numerals in FIG. 1 and FIG. 3 denote the same components. The difference between both is the design of the source electrode 250 and the drain electrode 260. The drain electrode 260 of the pixel structure 200 also has a U-shaped electrode part 264. As compared with the above-mentioned embodiment, in the drain electrode 260, the connecting part 166 is connected to the base of the U-shaped electrode part 264. In addition, the source electrode 250 of this embodiment has a strip shape. A first end of the source electrode 250 is connected to the data line 120, and a second end of the source electrode 250 is surrounded by the U-shaped electrode part 264.

It is to be noted that the pixel structure 200 also includes the extending electrode 170 and the semiconductor pattern 190. The first end 172 of the extending electrode 170 points to the semiconductor layer 140 along the direction D, and the overlaps the contact part 162. The semiconductor pattern 190 is disposed between the first end 172 of the extending electrode 170 and the contact part 162. Similarly, the effect of the capacitor due to the overlapping of the extending electrode 170 and the contact part 162 is substantially equivalent to the effect of the capacitor between the electrode part 264 and the gate electrode 130. In addition, the first end 172 of the extending part 170 and the connecting part 162 have the same width, and the first end 172 of the extending part 170 and the connecting part 166 are respectively disposed at two opposite sides of the contact part 162. The gate-drain parasitic capacitance in the TFT still does not vary after the drain electrode 260 shifts horizontally relative to the gate electrode 130. Therefore, the display picture quality of the pixel structure 200 is excellent, and the pixel structure 200 will not be negatively affected by the misalignment.

Figure 4:
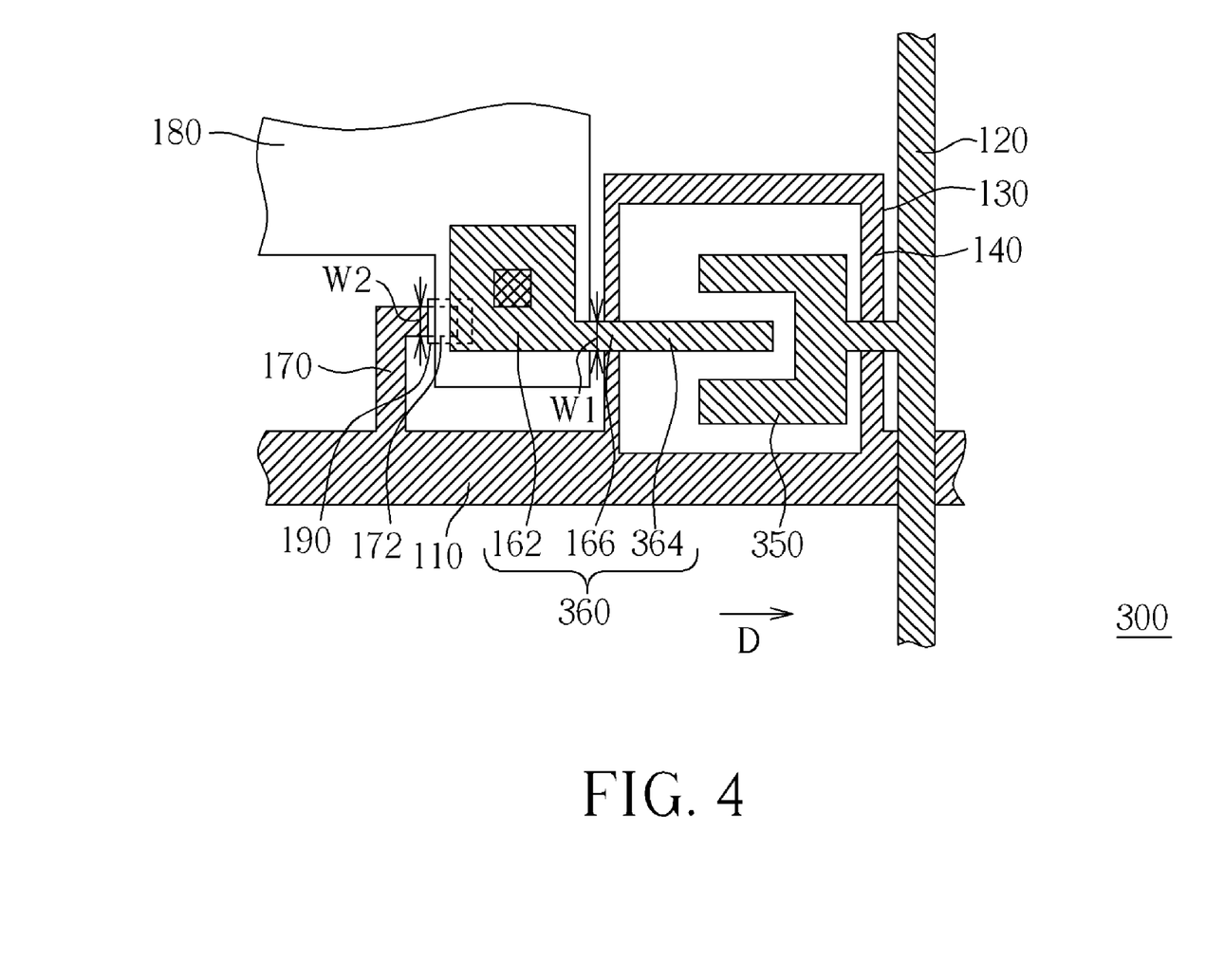
FIG. 4 is a sectional top view of a pixel structure according to a third embodiment of the present invention.

FIG. 4 is a sectional top view of a pixel structure according to a third embodiment of the present invention. As shown in FIG. 4, the pixel structure 300 has the same design as the pixel structure 100 except that the design of the source electrode 350 and the drain electrode 360 is different from the design of the pixel structure 100, and the same numerals in FIG. 1 and FIG. 4 denote the same components.

The pixel structure 300 has a U-shaped source electrode 350. The electrode part 364 and the connecting part 166 of the drain electrode 360 constitute a strip pattern, and the U-shaped source electrode 350 surrounds the electrode part 364. Actually, the electrode part 364 and the connecting part 166 are respectively different parts of the strip pattern. The electrode part 364 is the part of the strip pattern surrounded by the source electrode 350, and the connecting part 166 is the part of the strip pattern extending from the contact part 162 into the region of the gate electrode 130 along the direction D.

In this embodiment, the pixel structure 300 also has a constant gate-drain parasitic capacitance. That is, the embodiment also includes the extending electrode 170 connected to the scan line 110 and the corresponding semiconductor pattern 190. The extending electrode 170 overlaps the contact part 162, and the semiconductor pattern 190 is disposed at the overlapping area of the extending electrode 170 and the contact part 162. Furthermore, the first width W1 of the connecting part 166 is equal to the second width W2 of the first end 172 of the extending electrode 170. When the relative deviation between the gate electrode 130 and the drain electrode 360 occurs, the overlapping area of the drain electrode 360 and the extending electrode 170 and the overlapping area of the drain electrode 360 and the gate electrode 130 will vary accordingly. Although the misalignment is generated during the manufacturing process, the pixel structure 300 also has the same operating efficiency as the predetermined layout. The gate-drain parasitic capacitance is the same as that of the predetermined layout. Therefore, the pixel structure 300 has a higher tolerance for misalignment, and the display picture quality is easily controlled.

Figure 5:
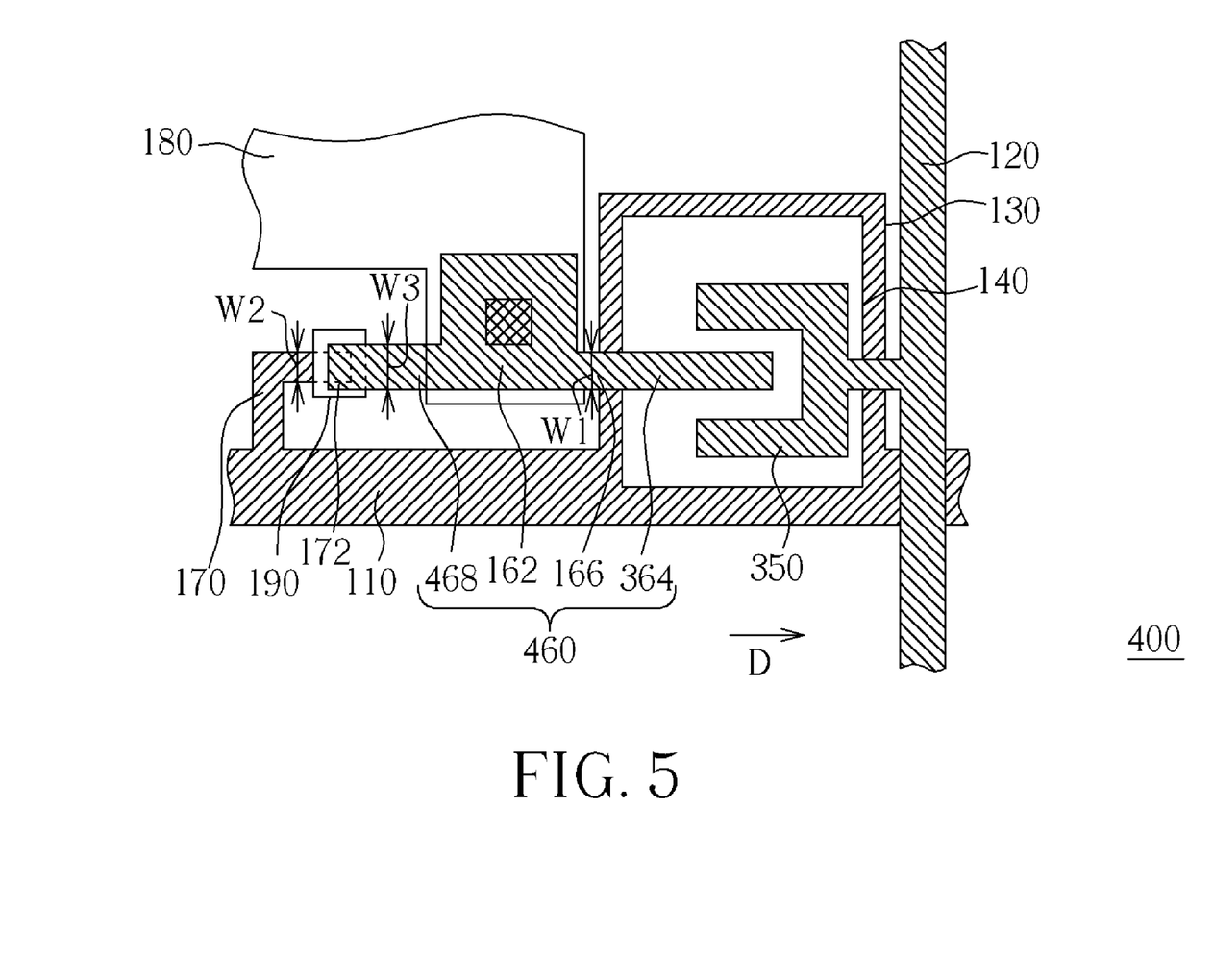
FIG. 5 is a schematic diagram showing a sectional top view of a pixel structure according to a fourth embodiment of the present invention.

Furthermore, FIG. 5 is a schematic diagram showing a sectional top view of a pixel structure according to a fourth embodiment of the present invention. As shown in FIG. 5, the design of the pixel structure 400 is derived from the pixel structure 300, and the same numerals in the pixel structure 300 and the pixel structure 400 denote the same components. In order to keep the gate-drain parasitic capacitance stable, the drain electrode 460 of the pixel structure 400 further includes a protrusion part 468. The contact part 162 is disposed between the connecting part 166 and the protrusion part 468. It should be noted that the protrusion part 468 is parallel to the direction D, and overlaps the extending electrode 170 in this embodiment.

In this embodiment, a side of the contact part 162 away from the connecting part 166 extends outside the contact part 162 to form the protrusion part 468, and the protrusion part 468 overlaps the extending electrode 170 in order to keep the stability of the gate-drain parasitic capacitance. Moreover, in order to ensure that the gate-drain parasitic capacitance does not vary due to the misalignment, the protrusion part 468 has a third width W3, and the third width W3 is at least equal to or larger than the second width W2. The first width W1 is also equal to the second width W2. That is, the first end 172 of the extending electrode 170 in a direction of width is fully covered with the protrusion part 468. The pixel structure 400 can have a good display picture quality, and the tolerance for the misalignment also is greatly improved.

Figure 6:
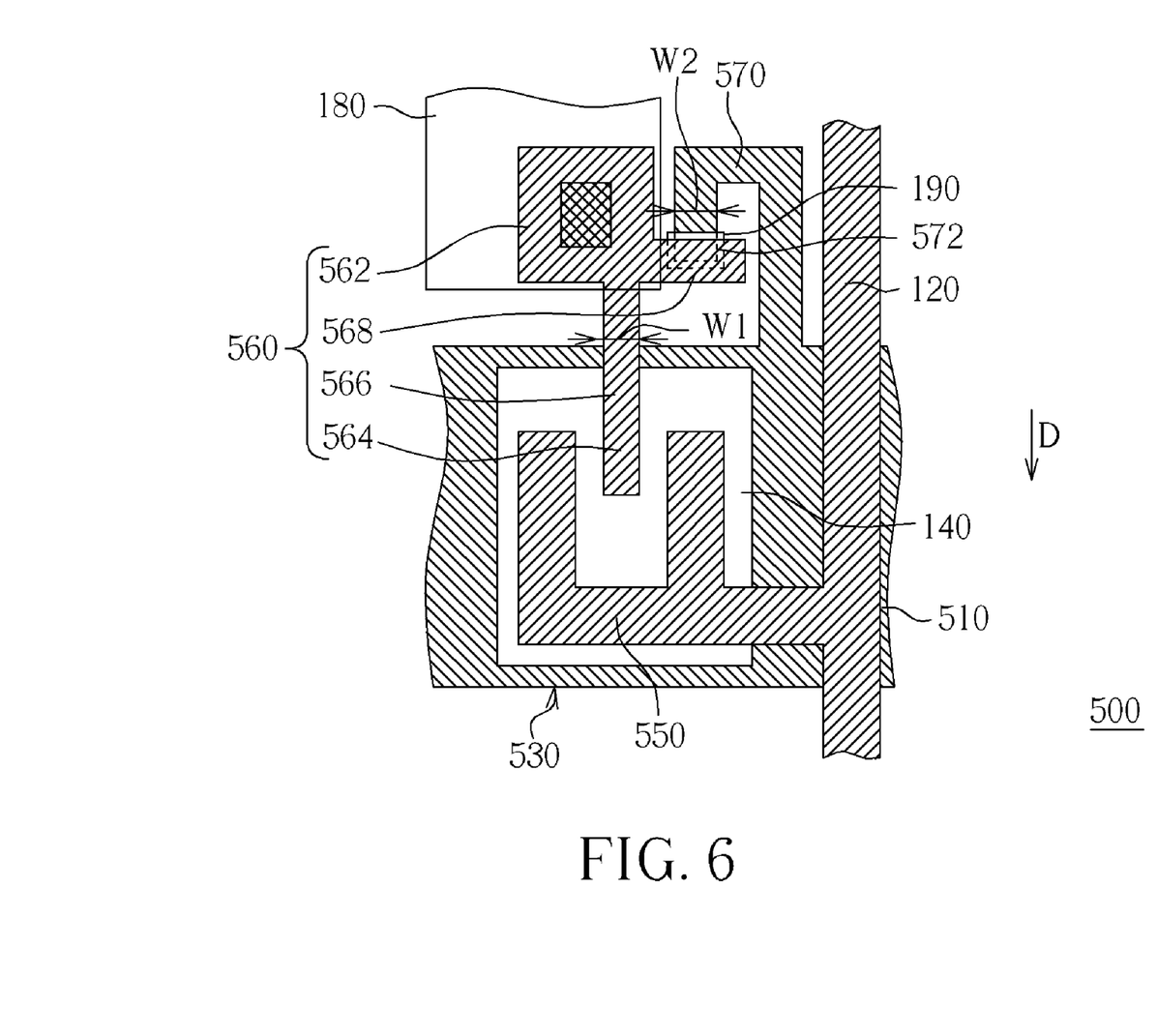
FIG. 6 depicts a sectional top view of a pixel structure according to a fifth embodiment of the present invention.

The above-mentioned embodiments describe the L-shaped extending electrode, but the shape of the extending electrode also can vary according to different designs of the pixel structure. FIG. 6 depicts a sectional top view of a pixel structure according to a fifth embodiment of the present invention. As shown in FIG. 6, the pixel structure 500 includes a scan line 510, a data line 120, a gate electrode 530, a semiconductor layer 140, a source electrode 550, a drain electrode 560, an extending electrode 570, a pixel electrode 180 and a semiconductor pattern 190. The scan line 510 and the data line 120 cross each other, and are electrically insulated from each other. The gate electrode 530 is substantially a part of the scan line 510. The semiconductor layer 140 is disposed on the gate electrode 530. The source electrode 550 has at least a portion disposed on the semiconductor layer 140, and the drain electrode 560 has at least a portion disposed on the semiconductor layer 140. The source electrode 550 is connected to the data line 120. The extending electrode 570 is connected to the scan line 510, and the extending electrode 570 is substantially extended from the gate electrode 530. In other words, the extending electrode 570 of this embodiment is connected to the gate electrode 530. The pixel electrode 180 is connected to the drain electrode 560. Furthermore, the semiconductor pattern 190 is disposed between the extending electrode 570 and the drain electrode 560, and is disposed at the overlapping area of the extending electrode 570 and the drain electrode 560.

The extending electrode 570 of this embodiment is U-shaped. A first end 572 of the extending electrode 570 is not connected to any other component, and a second end of the extending electrode 570 is connected to the gate electrode 530. The drain electrode 560 includes a contact part 562, an electrode part 564, a connecting part 566 and a protrusion part 568.

The contact part 562 is disposed outside the scan line 510 and the gate electrode 530. The electrode part 564 is disposed on the semiconductor layer 140, and the electrode part 564 is surrounded by the U-shaped source electrode 550. The connecting part 566 is partially disposed outside the gate electrode 530, and extends from the contact part 562 to connect the electrode part 564 along the direction D. The protrusion part 568 is parallel to an edge of the gate electrode 530, and does not overlap the gate electrode 530. The protrusion part 568 is connected to the contact part 562, and overlaps the extending electrode 570.

In this embodiment, the extending electrode 570 has the first end 572 that is not connected to any component. The first end 572 points to the semiconductor layer 140 along the direction D, and overlaps the protrusion part 568 of the drain electrode 560. When a misalignment is generated along the direction D or the opposite direction of the direction D during the alignment step, the relative position between the gate electrode 530 and the contact part 562 will be closer or farther. When the relative position between the gate electrode 530 and the contact part 562 is closer, the overlapping area of the connecting electrode 566 and the gate electrode 530 is increased, and the overlapping area of the protrusion part 568 and the extending electrode 570 is reduced. On the contrary, when the relative position between the gate electrode 530 and the contact part 562 is farther, the overlapping area of the connecting part 566 and the gate electrode 530 is reduced, and the overlapping area of the protrusion part 568 and the extending electrode 570 is increased.

The extending electrode 570 and the gate electrode 530 are electrically connected to each other. Similarly, the effect of the capacitor due to the overlapping of the extending electrode 570 and the protrusion part 568 is substantially equivalent to the effect of the capacitor due to the overlapping of the connecting part 566 and the gate electrode 530. Based on this relation, the gate-drain parasitic capacitance in the pixel structure 500 is determined by the overlapping area of the extending electrode 570 and the protrusion part 568 and the overlapping area of the connecting part 566 and the gate electrode 530. In order to maintain the overlapping area of the gate electrode 530 and the drain electrode 560, a first width W1 of the connecting part 566 is substantially equal to a second width W2 of the first end 572. The drain electrode 160 overlaps the gate electrode 130 to form a first overlapping area, and the drain electrode 160 overlaps the extending electrode 170 to form a second overlapping area. When the relative deviation between the gate electrode 530 and the drain electrode 560 occurs due to the misalignment during the manufacturing process of the pixel structure 500, the sum of the first overlapping area and the second overlapping area will not vary. Therefore, the gate-drain parasitical capacitance in the pixel structure 500 is maintained, and will not vary due to the misalignment. The pixel structure 500 has a good display picture quality and stable device characteristic.

In summary, the present invention disposes an extending electrode electrically connected to the gate electrode in the pixel structure, and an end of the extending electrode overlaps the drain electrode. When the misalignment is generated during the manufacturing process of the pixel structure, the gate-drain parasitic capacitances still are the same as that of the predetermined layout. For this reason, the pixel structure has a good display picture quality, and a problem of image flicker is not easily generated in the application of display. The tolerance for the misalignment of the pixel structure in the present invention also can be greatly improved.

Those skilled in the art will readily observe that numerous modifications and alterations of the device and method may be made while retaining the teachings of the invention.

What is claimed is:

1. A pixel structure, comprising:
   a scan line and a data line, crossing each other and electrically insulated from each other;
   a gate electrode, electrically connected to the scan line;
   a semiconductor layer, disposed on the gate electrode;
   a source electrode, having at least a portion disposed on the semiconductor layer, and connected to the data line;
   a drain electrode, having at least a portion disposed on the semiconductor layer, the drain electrode comprising:
      a contact part, disposed outside the gate electrode;
      an electrode part, disposed on the semiconductor layer; and
      a connecting part, extending from the contact part along a direction to connect the electrode part and overlapping a portion of the gate electrode, and the connecting part having a first width;
   an extending electrode, connected to the scan line, the extending electrode having a first end pointing to the semiconductor layer along the direction and overlapping the drain electrode, the extending electrode having a second width, and the first width being substantially equal to the second width; and
   a pixel electrode, connected to the contact part of the drain electrode.

2. The pixel structure of claim 1, further comprising a semiconductor pattern, disposed between the extending electrode and the drain electrode and located at an overlapping area of the extending electrode and the drain electrode.

3. The pixel structure of claim 1, wherein the extending electrode has a second end away from the first end, and the second end is connected to the scan line.

4. The pixel structure of claim 3, wherein the extending electrode is L-shaped.

5. The pixel structure of claim 3, wherein the extending electrode is substantially U-shaped.

6. The pixel structure of claim 1, wherein the electrode part of the drain electrode is a U-shaped part surrounding the source electrode, and the U-shaped part has a base and two branches extending from two ends of the base toward the direction.

7. The pixel structure of claim 6, wherein the connecting part of the drain electrode is connected to the base or one of the branches of the U-shaped part.

8. The pixel structure of claim 1, wherein the source electrode has a U-shape so that it surrounds the electrode part of the drain electrode.

9. The pixel structure of claim 8, wherein the electrode part of the drain electrode and the connecting part are connected to each other, and form a strip pattern.

10. The pixel structure of claim 1, wherein the drain electrode further comprises a protrusion part, the contact part is disposed between the connecting part and the protrusion part, and the protrusion part is parallel to the direction and overlaps the extending electrode.

11. The pixel structure of claim 1, wherein the drain electrode further comprises a protrusion part, parallel to an edge of the gate electrode and located outside the gate electrode, and the protrusion part is connected to the contact part and overlaps the extending electrode.

12. The pixel structure of claim 1, wherein the contact part, the electrode part and the connecting part of the drain electrode are formed integrally.

13. The pixel structure of claim 1, wherein the source electrode and the data line are formed integrally.

14. The pixel structure of claim 1, wherein the gate electrode is a portion of the scan line.

15. The pixel structure of claim 14, wherein the extending electrode is connected to the gate electrode.

16. The pixel structure of claim 1, wherein the gate electrode extends from the scan line to form at least a portion of the gate electrode outside the scan line.

* * * * *